(12) United States Patent
Wang et al.

(10) Patent No.: US 11,277,904 B2
(45) Date of Patent: Mar. 15, 2022

(54) CIRCUIT BOARD, BACKLIGHT MODULE COMPRISING THE CIRCUIT BOARD, AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Xuefeng Wang, Beijing (CN); Guohui Chen, Beijing (CN); Hang Min, Beijing (CN); Qiangsheng Han, Beijing (CN); Wei Chen, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 939 days.

(21) Appl. No.: 16/064,089

(22) PCT Filed: Dec. 11, 2017

(86) PCT No.: PCT/CN2017/115432
§ 371 (c)(1),
(2) Date: Jun. 20, 2018

(87) PCT Pub. No.: WO2018/214472
PCT Pub. Date: Nov. 29, 2018

(65) Prior Publication Data
US 2021/0212199 A1 Jul. 8, 2021

(30) Foreign Application Priority Data
May 25, 2017 (CN) .......................... 201720591787.2

(51) Int. Cl.
*H05K 1/02* (2006.01)
*H05K 1/09* (2006.01)

(52) U.S. Cl.
CPC ........... *H05K 1/0254* (2013.01); *H05K 1/028* (2013.01); *H05K 1/092* (2013.01);
(Continued)

(58) Field of Classification Search
CPC ......................................... H05K 1/0277–0283
See application file for complete search history.

(56) References Cited

U.S. PATENT DOCUMENTS

| 2011/0156593 | A1* | 6/2011 | De Greef | H05B 45/14 315/130 |
| 2014/0293146 | A1 | 10/2014 | Tang et al. | |
| 2017/0055335 | A1 | 2/2017 | Wang et al. | |

FOREIGN PATENT DOCUMENTS

| CN | 202748570 U | 2/2013 |
| CN | 103198885 A | 7/2013 |

(Continued)

OTHER PUBLICATIONS

Search Report and Written Opinion for International Application No. PCT/CN2017/115432 dated Mar. 6, 2018.

(Continued)

*Primary Examiner* — Jeremy C Norris
(74) *Attorney, Agent, or Firm* — Calfee, Halter & Griswold LLP

(57) ABSTRACT

The disclosure discloses a circuit board, as well as a backlight module and a display device including the circuit board. The circuit board includes a copper exposure region which is covered with a conductive ink. By means of the copper exposure region and the conductive ink thereon, the function of conducting electrostatic charges for the circuit board can be realized at low cost in high efficiency, thereby (Continued)

reducing the risk of subjecting the electrical elements on the circuit board to electrostatic breakdown.

11 Claims, 1 Drawing Sheet

(52) U.S. Cl.
CPC ............... *H05K 2201/0746* (2013.01); *H05K 2201/10128* (2013.01); *H05K 2201/10174* (2013.01)

(56) References Cited

FOREIGN PATENT DOCUMENTS

| | | |
|---|---|---|
| CN | 203951675 U | 11/2014 |
| CN | 104730746 A | 6/2015 |
| CN | 105090831 A | 11/2015 |

OTHER PUBLICATIONS

First Office Action Report for Chinese Patent Application No. 201720591787.2 dated Dec. 1, 2017.

\* cited by examiner

CIRCUIT BOARD, BACKLIGHT MODULE COMPRISING THE CIRCUIT BOARD, AND DISPLAY DEVICE

CROSS REFERENCE OF RELATED APPLICATION

The present application is the U.S. national phase entry of PCT/CN2017/115432, with an international filling date of Dec. 11, 2017, which claims the right of priority to the Chinese Patent Application No. 201720591787.2 filed on May 25, 2017, the entire disclosure of which is incorporated herein by reference.

TECHNICAL FIELD

The present disclosure relates to the field of circuit board technologies, and more specifically to electrostatic protection for a circuit board and a display device comprising the circuit board.

BACKGROUND

Circuit board is a plate-like component that is commonly used in electronic devices. Different electrical elements can be assembled on the circuit board as need, for example, an integrated circuit chip, a resistor, a capacitor, a switch transistor, various loads such as a light emitting diode, and the like. These electrical elements may be electrically connected with each other via conductive lines formed in the circuit board to achieve a desired function, for example, a power board for providing a low DC (direct current) voltage, a driving circuit board for controlling the operation of a switch element, a control circuit board for controlling the operation of a load element, and the like. Due to external electromagnetic interference and other factors, an electrostatic phenomenon often occurs during the operation of an electronic device, and electrostatic charges may accumulate on the circuit board of the electronic device. This is unfavorable to the normal operation of the electronic device and may cause electrostatic breakdown to some electrical elements of the electronic device, thereby affecting the normal operation of the electronic device.

SUMMARY

A circuit board provided by an embodiment of the present disclosure comprises a copper exposure region, the copper exposure region being covered with a conductive ink.

The conductive ink mentioned herein includes inks made of conductive materials, for example, gold-based conductive inks, silver-based conductive inks, copper-based conductive inks, carbon-based conductive inks, etc. However, the conductive ink that can be used in the disclosure is not so limited, and any conductive fluid or liquid that can be coated on the copper exposure region of the circuit board to form a conductive layer combined with the copper exposure region is considered as the conductive ink of the disclosure.

In some embodiments, the copper exposure region is located in a peripheral area of the circuit board.

In some embodiments, the copper exposure region includes a plurality of sub-copper exposure regions located in the peripheral area of the circuit board, and each of the sub-copper exposure regions is covered with a conductive ink.

In some embodiments, the circuit board is a flexible circuit board and is configured to drive a light emitting device in the backlight module to emit light.

Another embodiment of the present disclosure provides a backlight module comprising a circuit board configured to drive a light emitting device in the backlight module to emit light. The circuit board comprises a copper exposure region, and the copper exposure region is covered with a conductive ink.

In some embodiments, the backlight module comprises a backplate. The circuit board is positioned so that the copper exposure region of the circuit board faces an inner surface of the backplate and the conductive ink is brought into contact with the inner surface of the backplate.

In some embodiments, the light emitting device includes a plurality of transient voltage suppression diodes, the plurality of transient voltage suppression diodes being distributed on the circuit board at intervals.

In some embodiments, the circuit board is a strip flexible circuit board, and the circuit board and a plurality of light emitting devices distributed thereon constitute a strip light emitting assembly.

In some embodiments, the copper exposure region at least includes a sub-copper exposure region located at one end of the flexible circuit board, and the sub-copper exposure region is covered with the conductive ink.

A further embodiment of the present disclosure provides a display device, which may comprise a backlight module as described in any of the foregoing embodiments.

Some embodiments provided herein are briefly described above. These embodiments as well as corresponding features and advantages will become more apparent and explicit from the detailed description below.

BRIEF DESCRIPTION OF DRAWINGS

Embodiments of the disclosure will be described in more detail below by way of non-limiting examples with reference to the accompanying drawings to provide a thorough understanding of the principle and spirit of the present disclosure.

DETAILED DESCRIPTION OF EMBODIMENTS

Figure 1:
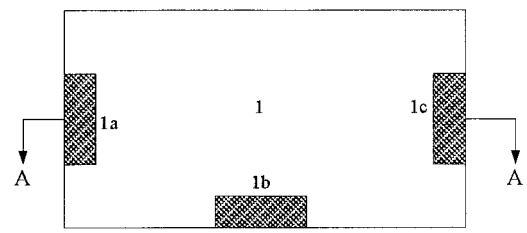
FIG. 1 schematically shows a plan view of a circuit board according to an embodiment of the present disclosure.

Embodiments of the disclosure will be described below by way of example with reference to the drawings. The described embodiments are only part of various possible embodiments of the invention, rather than all of them. Other embodiments obtained based on the embodiments herein also fall within the protection scope of the invention. In addition, it is to be noted that the positions, shapes, and sizes of the various features shown in the drawings do not represent the shapes and sizes of related features in an actual product, and the drawings are merely used to schematically show the principles and structures of the embodiments of the disclosure. The present invention is not limited to the embodiments described herein.

A circuit board provided by an embodiment of the present disclosure comprises a copper exposure region, and the copper exposure region is covered with a conductive ink. The copper exposure region is provided on the circuit board, which makes it possible to release or conduct away the electrostatic charges accumulated on the circuit board. The conductive ink covering the copper exposure region provides a good condition for sufficient contact between the circuit board and other components of an electronic device using the circuit board. That is, the electrostatic charges on the circuit board can be transferred to other components (for example, housing, frame, etc.) of the electronic device via the copper exposure region and the conductive ink, thereby achieving the effect of conducting the electrostatic charges away, and reducing as much as possible the risk that the electrical elements of the circuit board may be damaged due to electrostatic breakdown.

A conventional method for reducing or eliminating accumulated electrostatic charges in an electronic device such as a mobile phone is to dispose a conductive adhesive on the circuit board of the electronic device. For example, the conductive adhesive is used to bond the mainboard of the mobile phone and the metal frame of the mobile phone, thereby conducting the electrostatic charges away from the mainboard of the mobile phone. However, the conductive adhesive has a high cost and is difficult to adhere to. That is, the usage of a conductive adhesive leads to high material cost and assembling cost, which are especially pronounced in the case of producing electronic devices on a large scale. In addition, after a period of use, the conductive adhesive may be easy to fall off, and it is generally difficult for a user to find that the conductive adhesive has fallen off in a finished electronic device. In this case, the risk of electrostatic breakdown is actually not eliminated.

The circuit board provided by an embodiment of the present disclosure can relieve or alleviate the above problem. The conductive ink can be coated onto the copper exposure region of the circuit board by spraying. Compared with the conductive adhesive that is manually applied, the conductive ink is less difficult to spray, and the efficiency is significantly higher. With the conductive ink covering the copper exposure region, the contact between other related components of the electronic device and the copper exposure region of the circuit board can be enhanced, so that the electrostatic charges on the circuit board can be effectively conducted away when the electronic device is in operation. In addition, the high cost of using and assembling the conductive adhesive as well as the problem that the conductive adhesive is easy to fall off can be avoided, thereby contributing to reducing the cost of the electronic device and enhancing the stability of the electrostatic protection ability for the electronic device. Therefore, the circuit board proposed by the embodiment of the disclosure can realize electrostatic protection at relatively low cost, and is advantageous to enhancing the stability of the electrostatic protection for the electronic device using the circuit board.

Moreover, by arranging the copper exposure region on the circuit board, electrostatic charges accumulated on the circuit board can be conducted to the copper exposure region, thereby providing conditions for releasing or conducting away the electrostatic charges. On the one hand, the conductive ink covering the copper exposure region has conductive property and can continue to conduct the electrostatic charges on the circuit board to other components (e.g. housing, etc.) of the electronic device using the circuit board, and on the other hand, the conductive ink can also fill the gap that may exist between the copper exposure region of the circuit board and other components of the electronic device, so that the copper exposure region of the circuit board can be in full contact with other components of the electronic device. Therefore, the arrangement of the conductive ink can further ensure that the electrostatic charges on the circuit board can be effectively conducted away and enhance the stability of the antistatic ability of the circuit board.

Referring to FIG. 1 which schematically shows a plan view of a circuit board provided by an embodiment, a circuit board 1 comprises a copper exposure region (e.g., 1a, 1b and 1c), and the copper exposure region is covered with a conductive ink (shown by a shaded area in FIG. 1). The specific elements and wirings on the circuit board are not shown in FIG. 1, as they are irrelevant to the embodiment of FIG. 1.

The conductive ink mentioned herein includes inks made of conductive materials. For example, the ink can be made by dispersing a conductive material such as gold, silver, copper, and carbon in a binding material, thereby obtaining, for example, gold-based conductive ink, silver-based conductive ink, copper-based conductive ink, and carbon-based conductive ink. However, the conductive ink mentioned herein is not so limited. Any conductive fluid or liquid that can be coated on the copper exposure region of the circuit board to form a conductive layer combined with the copper exposure region should be considered as the conductive ink of the invention.

In some embodiments of the present disclosure, the copper exposure region is located in the peripheral area of the circuit board. For example, as shown in FIG. 1, the copper exposure regions (1a, 1b, and 1c) are located in the peripheral area of the circuit board 1. In this way, the electrical elements and wirings in the circuit board 1 can be less affected. Of course, the number of copper exposure regions arranged on a single circuit board is not limited in the present disclosure. A single circuit board may comprise only one copper exposure region, and may also comprise a plurality of sub-copper exposure regions. As shown in FIG. 1, in some embodiments, the copper exposure region of the circuit board 1 includes a sub-copper exposure region 1a, a sub-copper exposure region 1b, and a sub-copper exposure region 1c located in the peripheral area of the circuit board. Each sub-copper exposure region is covered with a conductive ink. By arranging a plurality of sub-copper exposure regions, the area of the entire copper exposure region can be increased, and the ability of the circuit board 1 in conducting electrostatic charges away can be enhanced. It can be understood that the number and positions of the sub-copper exposure region 1a, the sub-copper exposure region 1b, and the sub-copper exposure region 1c shown in FIG. 1 do not constitute a limitation to the invention, and those skilled in the art can determine a reasonable number of sub-copper exposure regions and positions of the sub-copper exposure regions on the circuit board based on practical applications of the circuit board 1. For example, instead of the embodiment of FIG. 1, the sub-copper exposure region 1a, the sub-copper exposure region 1b, and the sub-copper exposure region 1c may be located on the same edge of the circuit board 1.

Figure 2:
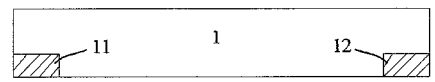
FIG. 2 schematically shows a sectional view of FIG. 1 taken along line A-A in FIG. 1.

FIG. 2 schematically shows a sectional view taken along line A-A shown in FIG. 1. Conductive inks 11 and 12 covering the sub-copper exposure region 1a and the sub-copper exposure region 1b are shown in FIG. 2. No limitation is imposed on the thickness of the conductive ink in the invention, as long as the conductive ink can sufficiently contact other conductive components of the electronic device.

The circuit board provided by the embodiment of the present disclosure can be applied to any suitable electronic device. For example, many display devices require a backlight source, so in an embodiment, the circuit board may be configured to drive a light emitting device in the backlight module to emit light and may have a flexible characteristic. That is, in this embodiment, the circuit board is a flexible circuit board for driving a light emitting device in the backlight module to emit light. In this case, the flexible circuit board may support the implementation of a flexible display device.

Another embodiment of the present disclosure provides a backlight module using the circuit board proposed by the present disclosure. Therefore, the backlight module comprises a circuit board configured to drive a light emitting device in the backlight module to emit light, and the circuit board comprises a copper exposure region covered with a conductive ink. In this case, the electrostatic charges accumulated on the circuit board can be conducted away via the copper exposure region and the conductive ink, and the risk of electrostatic breakdown for the light emitting device in the backlight module can be reduced or eliminated.

Figure 3:
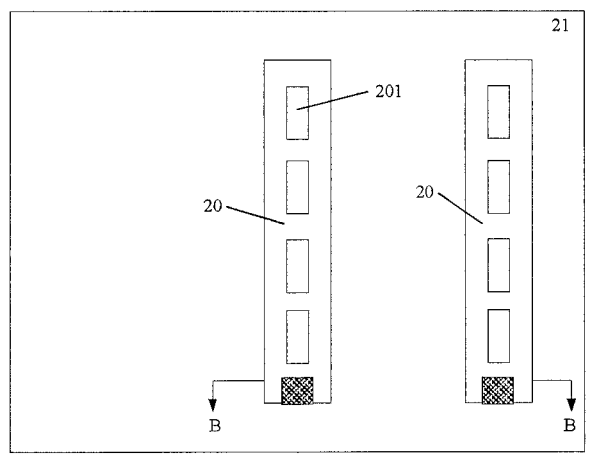
FIG. 3 schematically shows a partial plan view of a backlight module according to an embodiment of the present disclosure.

FIG. 3 schematically shows a partial plan view of a backlight module provided by an embodiment of the present disclosure. The backlight module comprises a backplate 21 and a circuit board 20. The circuit board 20 is positioned so that the copper exposure region of the circuit board 20 faces the inner surface of the backplate 21, and the conductive ink is brought into contact with the inner surface of the backplate 21. In FIG. 3, the copper exposure region covered with the conductive ink is schematically shown by a shaded area. In the backlight module, the backplate 21 is typically a metal plate. In this embodiment, electrostatic charges on the circuit board 20 may be conducted to the backplate 21 via the copper exposure region of the circuit board 20 and the conductive ink covering the copper exposure region, thereby achieving the effect of conducting the electrostatic charges away from the circuit board 20.

Figure 4:
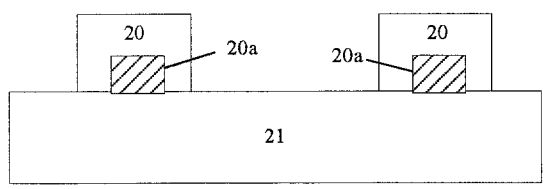
FIG. 4 schematically shows a partial sectional view of FIG. 3 taken along line B-B in FIG. 3.

FIG. 4 schematically shows a partial sectional view taken along line B-B in FIG. 3. As shown in FIG. 4, the copper exposure region of each circuit board 20 is covered with a conductive ink 20a, and the circuit board 20 is in contact with the backplate 21 via the copper exposure region and the conductive ink 20a. That is, the circuit board 20 is positioned such that the copper exposure region of the circuit board 20 faces the inner surface of the backplate 21, and the conductive ink is brought into contact with the inner surface of the backplate 21.

Those skilled in the art can understand that the light emitting device in the backlight module may be any electroluminescent device, including but not limited to various light emitting diodes (LEDs). In the embodiment of FIG. 3, the light emitting device includes a plurality of transient voltage suppression (TVS) diodes 201 which are distributed on the circuit board 20 at intervals. The TVS diode is a light emitting device with protection function. In case two terminals of the TVS diode are subjected to reverse transient high-energy impact, it is able to change high impedance between its two terminals to low impedance very rapidly and absorb up to several kilowatts of surge power, so that the voltage between two terminals is clamped at a predetermined value, thereby effectively protecting other electrical elements in the circuit board 20 from various surge pulses.

In the embodiment of FIG. 3, the backlight module may comprise a plurality of circuit boards 20. Each of the circuit boards 20 is a strip flexible circuit board. The circuit board 20 and a plurality of light emitting devices 201 distributed thereon form a stripe light emitting assembly. Such a stripe light emitting assembly is also sometimes referred to as a light bar. Therefore, for a light bar using the circuit board proposed by the embodiment of the invention, it would have a strong antistatic ability and the yield thereof can be improved. Moreover, as it is not required to use a conductive adhesive, the light bar is convenient to fabricate and install.

In an example of the strip circuit board, the copper exposure region may be provided at least at one position (e.g. one end) of each strip circuit board 20. That is, the copper exposure region at least includes a sub-copper exposure region located at one end of the flexible circuit board, and the sub-copper exposure region is covered with a conductive ink. For example, in the example of FIG. 3, each circuit board 20 may at least include one sub-copper exposure region located at the lower end of the circuit board 20, and the sub-copper exposure region is covered by a conductive ink, which is shown by a shaded block in FIG. 3.

Another embodiment of the present disclosure provides a display device comprising the backlight module as described in any of the foregoing embodiments. The display device in this embodiment may be any product or component having a display function such as a display panel, an electronic paper, a mobile phone, a tablet computer, a television, a notebook computer, a digital photo frame, a navigator, and the like. As previously discussed, for an electronic device using the circuit board provided by the embodiments of the disclosure, electrostatic protection of the circuit board and the electronic device can be realized at relatively low cost, and the stability of the electrostatic protection of the electronic device can be enhanced.

Embodiments of the disclosure have been described in detail above with reference to the drawings. However, it is to be noted that the above embodiments are used to illustrate but not limit the invention, and those skilled in the art will be able to design many substitutive embodiments without departing from the scope of the appended claims. In the claims, the word "comprising" does not exclude the presence of elements or steps other than those listed in the claims. The word "a" or "an" preceding an element does not exclude the presence of a plurality of such elements. The mere fact that certain features are recited in mutually different dependent claims does not indicate that a combination of these features cannot be used to advantage.

The invention claimed is:

1. A backlight module, comprising a circuit board configured to drive a light emitting device in the backlight module to emit light, wherein the circuit board comprises a copper exposure region, the copper exposure region is covered with a conductive ink,
    wherein the backlight module comprises a metal backplate, the circuit board is positioned such that the copper exposure region of the circuit board faces an inner surface of the metal backplate and the conductive ink directly contacts the inner surface of the metal backplate,
    wherein the conductive ink comprises a conductive material and a binding material, the conductive material comprises at least one selected from a group consisting of gold, silver, copper and carbon.

2. The backlight module according to claim 1, wherein the light emitting device comprises a plurality of transient voltage suppression diodes, the plurality of transient voltage suppression diodes are distributed on the circuit board at intervals.

3. The backlight module according to claim 1, wherein the circuit board is a strip flexible circuit board, and the circuit board and a plurality of light emitting devices distributed thereon constitute a stripe light emitting assembly.

4. The backlight module according to claim 3, wherein the copper exposure region at least comprises a sub-copper exposure region at one end of the flexible circuit board, the sub-copper exposure region is covered with the conductive ink.

5. A display device, comprising the backlight module according to claim 1.

6. The display device according to claim 5, wherein the light emitting device comprises a plurality of transient voltage suppression diodes, the plurality of transient voltage suppression diodes are distributed on the circuit board at intervals.

7. The display device according to claim 5, wherein the circuit board is a strip flexible circuit board, and the circuit board and a plurality of light emitting devices distributed thereon constitute a stripe light emitting assembly.

8. The display device according to claim 7, wherein the copper exposure region at least comprises a sub-copper exposure region at one end of the flexible circuit board, the sub-copper exposure region is covered with the conductive ink.

9. The backlight module according to claim 1, wherein the copper exposure region is located in a peripheral area of the circuit board.

10. The backlight module according to claim 9, wherein the copper exposure region comprises a plurality of sub-copper exposure regions located in the peripheral area of the circuit board, each sub-copper exposure region is covered with a conductive ink.

11. The backlight module according to claim 1, wherein the circuit board is a flexible circuit board and is configured to drive a light emitting device in a backlight module to emit light.

\* \* \* \* \*